United States Patent
Bottka et al.

[11] 3,976,873
[45] Aug. 24, 1976

[54] TUNABLE ELECTROABSORPTIVE DETECTOR

[75] Inventors: Nicholas Bottka, Ridgecrest; Edward A. Teppo; Victor L. Rehn, both of China Lake, all of Calif.

[73] Assignee: The United States of America as represented by the Secretary of the Navy, Washington, D.C.

[22] Filed: May 8, 1975

[21] Appl. No.: 575,769

[52] U.S. Cl.............................. 250/211 J; 250/199; 357/13
[51] Int. Cl.² ........................................ H01L 15/00
[58] Field of Search............... 250/199, 211 J, 211; 332/7.51; 357/13, 30, 58; 331/94.5 M; 351/160

[56] References Cited
UNITED STATES PATENTS

| | | |
|---|---|---|
| 3,270,293 | 8/1966 | Deloach et al.......................... 357/13 |
| 3,675,026 | 7/1972 | Woodall.......................... 250/211 J |
| 3,727,115 | 4/1973 | Shang ................................... 357/13 |

OTHER PUBLICATIONS

I.B.M. Technical Disclosure Bulletin, vol. 17, No. 7, Dec. 1974, p. 2022.

Using Tunable Lasers, Physics Today, July 1972, pp. 36–44.

Primary Examiner—Alfred E. Smith
Assistant Examiner—Tommy P. Chin
Attorney, Agent, or Firm—R. S. Sciascia; Roy Miller; Frank I. Gray

[57] ABSTRACT

A tunable, electroabsorptive, semiconductor detector or detector-modulator for detecting or modulating radiation near the absorptive edge of the detector, which edge can be tunably shifted by back biasing.

4 Claims, 2 Drawing Figures

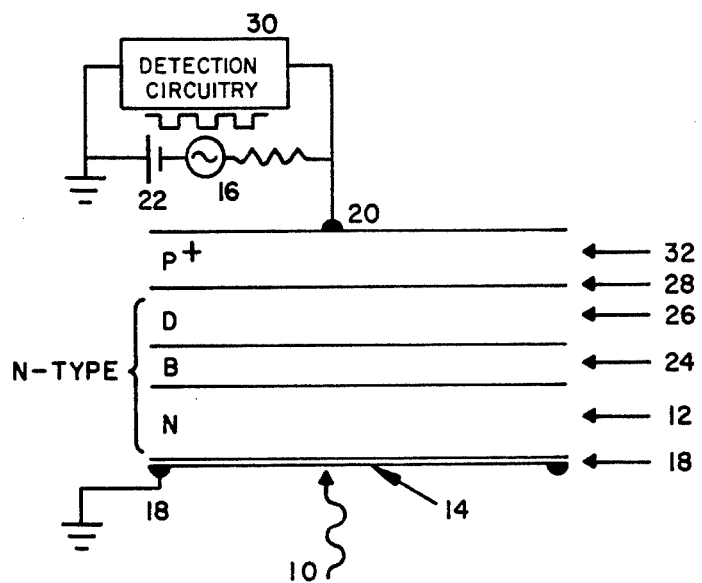
Fig. 1
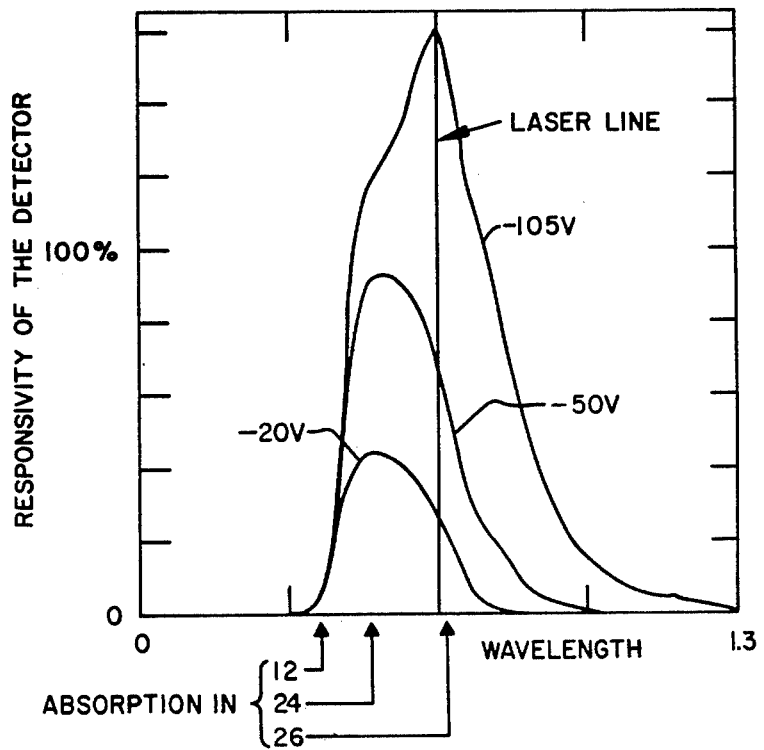

TUNABLE ELECTROABSORPTIVE DETECTOR

BACKGROUND OF THE INVENTION

In the field of electro-optics, solid state devices are being developed to improve existing apparatus and make possible functional achievements never before attainable. That is especially true in the field of communications where effective signal detection, among other, is a critical aspect of an efficient system.

Lasers which provide a relatively narrow radiation bandwidth are currently being developed for communications systems. The beam provided by the laser may act as the carrier and the information to be communicated may be impressed by modulation. In this respect such a system would be analogous to radio. Or the presence of the beam at a receiver, or its repetition rate, or its schedule may be significant. In this respect such a system would be analogous to radar. The systems are all electro-optic, however, and require an apparatus and technique for detecting the beam. The present invention is a novel electro-optic modulator that meets the requirement. It may also be operated as an electro-optic detector wherein the absorption edge of the semiconductor sandwich is adjusted to just include the radiation wavelength to be detected. Radiation of the wavelength will then be absorbed and detected by the present invention.

BRIEF DESCRIPTION OF THE DRAWINGS

FIG. 1 is a plan view of one preferred embodiment of the present invention configured as an electro-optic detector;

FIG. 2 is a representative graph showing a shift in absorptive edge of the semiconductor device in response to bias voltage variation.

DESCRIPTION OF THE PREFERRED EMBODIMENT

FIG. 1 shows a preferred embodiment of the present invention configured as a detector or detector-modulator. Incident radiation 10 from a source, either broad band or narrow band such as a laser, is directed onto entrance window 12 of the detector. Window 12 is a wide gap material substrate which transmits all incident radiation having a wavelength longer than its band gap. An anti-reflective coating 14 may be applied to the surface of window 12 to reduce reflective loss of the incident radiation and improve the device's effectiveness by constructive interference.

The detector is capable of detecting incident radiation near its band gap. Detection is accomplished by photon absorption in the detector's active region. The detector is back biased by dc voltage supply 22 across ring contact 18 and contact 20 on opposite surfaces of the detector, which bias shifts the absorption edge of the device. Modulation voltage 16, such as a signal having a frequency of repetitive high and low voltage values, may be applied to the already back biased device. As the level of modulation voltage 16 varies, the absorption edge of the device is shifted to transmit or absorb different frequencies occurring within incident radiation 10.

The following modes of operation are envisioned:

a. Modulative Filter

Monochromatic radiation 10 transmitted through the device and having optical frequencies near the absorption edge of the modulator (region 26) will carry the information contained in the modulation signal of source 16. Optical frequencies in radiation 10 higher in photon energy than the absorption edge of the window material 12 will be absorbed by the latter and will not be transmitted through the device. Optical frequencies lower in photon energy than the maximum shifted edge of 26 due to electroabsorption will be transmitted, but will not carry modulation information. The optical frequency bandwidth of the device (beyond the absorption edge of 12) which carries modulation information depends upon the magnitude of the applied bias on the device by supply 22. Thus, various bias conditions will represent different "color" bands upon which the modulation signal is imposed.

b. Tunable Narrow Bandwidth Detector

As in (a) above, various bias conditions will allow the device to be tuned to a particular band of optical frequencies in radiation 10. These frequencies will be absorbed and then detected via the circuitry 30. This detection scheme is shown in FIG. 2 where different bandwidths of information can be detected by applying various reverse biases to the device. Modulation information within the frequency bandwidth of the device and carried on radiation 10 can be demonstrated by this scheme.

c. Single Optical Frequency Light Switch and Detector

If the source is of single color such as a narrow line width laser, then the device can be used as a light switch to block the transmission of that color thru the device (thus absorbing it and detecting it via circuitry 30) by applying a reverse bias. The maximum electroabsorption is chosen to coincide with the laser line for some optimum applied bias (see FIG. 2). Such a scheme would provide the option of detection of the laser radiation (voltage on) or transmission (no detection) of that radiation through the device (voltage off).

When back biased by such as bias voltage 22, the semiconductor sandwich will include $P^+$ material 32 as the rear window and an $N^-$ material sandwich including entrance window 12, buffer zone 24 and depletion layer 26. The active region consisting of abrupt p-n junction 28 is of such alloy composition that its absorption edge lies at a wavelength just below incident radiation 10. By applying a large reverse bias voltage to this p-n junction two effects take place. First, a high electric field within depletion region 26 of junction 28 shifts the absorption edge of the active material towards longer wavelengths to the point that now incident radiation 10 will be absorbed. If a lesser reverse bias voltage is applied, the absorption edge will be shifted to a lesser extent and only slightly shorter wavelengths will be absorbed, permitting the longer wavelengths of incident radiation 10 to traverse the device and exit its rear window. The shift is the well known Franz-Keldysh effect in both cases. Secondly, photo carriers created in the high field region are accelerated and will ionize other charge pairs, thus creating avalanche multiplication. The absorption and avalanche gains will depend upon the applied voltage, or bias.

The present invention is a tunable responsivity electroabsorptive detector and detector-modulator based on the wavelength shift of the absorption edge of the material in the presence of a high electric field, i.e., the Franz-Keldysh effect. Anti-reflectance coated entrance window 12 is a wide gap material substrate which transmits all incident radiation having a wavelength longer than its band gap. Buffer region 24 serves as a lattice match between the substrate material and the subsequent ternary alloys. The active region at junction 28 is of such alloy composition that its absorption edge lies at wavelengths just below the incident radiation. By applying a large reverse bias voltage to p-n junction 28 the absorption edge of the active material is shifted toward longer wavelengths. This results because with large reverse bias voltage less energy is needed to raise the valence electrons within the depletion region to the electron band. If back bias is reduced, the absorption edge retreats to shorter wavelengths which have greater excitation energy. Also, photo carriers created in the high field region in and about junction 28 will be accelerated and ionize other charge pairs. Thereby, avalanche multiplication results. As stated above, the absorption and avalanche gains will depend upon the applied voltage.

The detector can be activated to detect a vary narrow band of incident radiation by carefully adjusting bias voltage 22. If the absorption edge of the detector is set to just include the wavelength to be detected, incident radiation of that wavelength will be absorbed and provide the excitation energy to create an electrical pulse that may be coupled to detection circuitry 30. If a single wavelength or narrow band of wavelengths are to be processed, external interference filters may be used to block all higher energy wavelengths. Or, instead, a modulation signal can be employed as described above to repeatedly shift the absorption edge back and forth as the means for detecting the single wavelength or narrow band of wavelengths that fall within the shift.

A detector as disclosed herein finds many applications including its use in common-optics range finders where detector saturation brought about by the transmitted laser pulse has heretofore been a problem. A modulation signal synchronized with the pulse repetition rate of the laser is used to shift the absorption edge of the present detector such that the detector is transparent to the transmitted radiation and turned on only after the radiation pulse exits. The detector would then be prepared to receive the returning radiation, detect it, and provide a detection pulse output.

The detector and detector-modulator of the present invention may be made of Gallium Arsenide and composed of the following layers. Substrate 12 may be GaAs. Buffer zone 24 may be $GaAs_u Sb_{1-u}$. Depletion layer 26 may be $GaAs_x Sb_{1-x}$. And, P$^+$ material 32 may be $GaAs_y Sb_{1-y}$. The structure may be made by known and presently employed semiconductor fabrication techniques.

FIG. 2 shows by example the absorption edge shift of the device of the present invention for various levels of back bias. For example, one hundred percent (100%) of the predominant neodymium:YAG laser output wavelength (1.06$\mu$) is within the absorption edge at −105 volts back bias. For lesser voltage values, such as −20v and −50v, the incident radiation from a neodymium:YAG laser will not be totally absorbed. Lesser negative levels of voltage result in lesser percentages of absorption to the extreme that at 0 volts the semiconductor sandwich is transparent.

To those skilled in the art it will be obvious upon a study of this disclosure that the present invention permits a variety of modifications and hence can be given embodiments other than particularly illustrated and described herein, without departing from the essential features of the invention and within the scope of the claims annexed hereto.

What is claimed is:

1. An optical radiation electroabsorptive device for selectively modulating transmitted optical frequencies and detecting other optical wavelengths of incident radiation frequencies near the absorption edge of the device comprising:

a semiconductor structure supportive of the Franz-Keldysh effect by shifting the absorption edge of the structure in response to application of an electric field, having a plurality of layers of N-type material and at least one layer of P-type material, wherein one of the layers of the N-type material is the first of said layers in the path of said radiation, the layer of P-type material is most remote of said layers from the source of said radiation, and one other layer of said N-type material is adjacent said P-type material; and means coupled to said structure for selectively establishing said electric field and predeterminedly shifting said absorption edge;

such that frequencies of said incident radiation are selectively modulated and absorbed by said structure.

2. The device of claim 1 wherein the layer of N-type material first in the path of said radiation is a substrate region having an anti-reflectance coating on its surface exposed to the incident radiation, the layer of N-type material adjacent said P-type material is the active region whereat modulation occurs, and said plurality of N-type materials further include a layer sandwiched between said substrate region and said active region as a buffer zone.

3. The device of claim 2 wherein said structure comprises layers of Gallium Arsenide.

4. The device of claim 3 wherein said substrate region is GaAs, said buffer zone is $GaAs_u Sb_{1-u}$, said active region is low dopant $GaAs_x Sb_{1-x}$, and said P-type material is $GaAs_y Sb_{1-y}$.

* * * * *